(12) United States Patent
Zhang

(10) Patent No.: US 10,505,140 B2
(45) Date of Patent: Dec. 10, 2019

(54) OLED DISPLAY PANEL AND METHOD FOR MANUFACTURING SAME

(71) Applicant: Shenzhen China Star Optoelectronics Semiconductor Display Technology Co., Ltd., Shenzhen (CN)

(72) Inventor: Yunan Zhang, Shenzhen (CN)

(73) Assignee: SHENZHEN CHINA STAR OPTOELECTRONICS SEMICONDUCTOR DISPLAY TECHNOLOGY CO., LTD., Guandong (CN)

( * ) Notice: Subject to any disclaimer, the term of this patent is extended or adjusted under 35 U.S.C. 154(b) by 0 days.

(21) Appl. No.: 15/576,712

(22) PCT Filed: Nov. 9, 2017

(86) PCT No.: PCT/CN2017/110197
§ 371 (c)(1),
(2) Date: Nov. 23, 2017

(87) PCT Pub. No.: WO2019/056524
PCT Pub. Date: Mar. 28, 2019

(65) Prior Publication Data
US 2019/0088898 A1   Mar. 21, 2019

(30) Foreign Application Priority Data
Sep. 20, 2017  (CN) .......................... 2017 1 0850038

(51) Int. Cl.
*H01L 51/56* (2006.01)
*H01L 27/32* (2006.01)
(Continued)

(52) U.S. Cl.
CPC ...... *H01L 51/5209* (2013.01); *H01L 27/3244* (2013.01); *H01L 51/005* (2013.01);
(Continued)

(58) Field of Classification Search
CPC . H01L 51/5209; H01L 51/56; H01L 51/0023; H01L 27/3244; H01L 51/5265;
(Continued)

(56) References Cited

U.S. PATENT DOCUMENTS

2002/0050597 A1* 5/2002 Hirose et al. ....... H01L 51/0035
257/82
2002/0153831 A1* 10/2002 Sakakura et al. ... H01L 27/1214
313/504
(Continued)

FOREIGN PATENT DOCUMENTS

| CN | 101132055 A | 2/2008 |
|---|---|---|
| CN | 105405983 A | 3/2016 |

OTHER PUBLICATIONS

Machine translation of Chinese Patent CN101132055(A), Yang et al. device for improving brightness and effiency of organic EL device date: Feb. 27, 2008, Univ Tianjin Technology.*
(Continued)

*Primary Examiner* — Thinh T Nguyen
(74) *Attorney, Agent, or Firm* — Mark M. Friedman

(57) ABSTRACT

The present disclosure provides an OLED display panel and a method for manufacturing the same. The OLED display panel includes an anode electrode layer, an anode electrode modifying layer, a first common layer, a light-emitting layer, a second common layer, and a cathode electrode layer. The anode electrode modifying layer is formed from an azobenzene-based compound. The azobenzene-based compound includes at least one functional group for transporting holes and at least one functional group for increasing solubility of the azobenzene-based compound in an organic solvent. In addition, the anode electrode modifying layer has a three-dimensional embossment grating structure.

2 Claims, 3 Drawing Sheets

(51) Int. Cl.
*H01L 51/52* (2006.01)
*H01L 51/00* (2006.01)
*H01L 51/50* (2006.01)

(52) U.S. Cl.
CPC ........ *H01L 51/006* (2013.01); *H01L 51/0023* (2013.01); *H01L 51/0061* (2013.01); *H01L 51/0068* (2013.01); *H01L 51/0072* (2013.01); *H01L 51/5056* (2013.01); *H01L 51/5265* (2013.01); *H01L 51/56* (2013.01); *H01L 51/0003* (2013.01); *H01L 2227/323* (2013.01); *H01L 2251/5315* (2013.01)

(58) Field of Classification Search
CPC ............. H01L 51/0072; H01L 51/0061; H01L 51/0068
USPC ............. 257/40, 59, 72; 438/82, 99, 48, 128
See application file for complete search history.

(56) References Cited

U.S. PATENT DOCUMENTS

| | | |
|---|---|---|
| 2010/0141612 A1 | 6/2010 | Desieres et al. |
| 2014/0124746 A1* | 5/2014 | Hwang ................. H01L 29/786 257/40 |
| 2015/0115226 A1 | 4/2015 | Scire et al. |
| 2016/0351815 A1* | 12/2016 | Papagni et al. ..... H01L 51/0036 |
| 2017/0033315 A1 | 2/2017 | Jang et al. |
| 2018/0090687 A1* | 3/2018 | Matsuo et al. ...... H01L 51/0071 |

OTHER PUBLICATIONS

Applied Physics letter incresed effiency of LED incorporating anodes functionalized with fourinated azobenzene monolayer WEB document date Oct. 10, 2012 , 11 pages American Institute of Physics.*

* cited by examiner

OLED DISPLAY PANEL AND METHOD FOR MANUFACTURING SAME

FIELD OF DISCLOSURE

The present disclosure relates to the field of flat display panel, and more particularly to an organic light-emitting diode (OLED) display panel and a method for manufacturing same.

BACKGROUND

Among flat display techniques, organic light emitting diode (OLED) displays possess many outstanding properties, including being light weight and having small thickness, self-illumination, short response times, wide viewing angles, wide color gamut, high brightness, and low power consumption, and thus, following liquid crystal displays, have gradually become a third generation of display techniques. Compared to liquid crystal displays (LCDs), OLED displays are more energy conscious and thinner in thickness, and have wider viewing angles. Currently, users are more unsatisfied with resolution of displays, but it is still challenging to manufacture OLED displays having high quality and high resolution.

An OLED display panel is one essential part of OLED displays. Conventionally, an OLED display panel includes a thin film transistor layer, an anode electrode layer formed on the thin film transistor layer, a pixel defining layer, a first common layer, a light-emitting layer, a second common layer, and a cathode layer. OLED display panels functionally work by transporting holes from the first common layer to the light-emitting layer and transporting electrons from the second common layer to the light-emitting layer under electric field generated between anode electrode and cathode electrode, and combining holes with electrons in the light-emitting layer, so as to achieve illumination.

Since passive displays having small area are more mature than before, active displays having large area nowadays have become the main stream where organic light-emitting development focuses. Thin film transistor (TFT) driving technique is required to achieve large area display. However, conventional bottom-emitting OLED (BOLED) devices use indium tin oxide (ITO) anode formed on transparent substrate as a light emission surface. Owing to use of a non-transparent silicon substrate, or use of a substrate composed of amorphous silicon with low mobility and organic TFT, it is prone to lead to a low aperture ratio. Therefore, to realize organic light-emitting active display screen having a large area and high brightness, top-emitting OLED devices are developed which solves the aperture ratio issue by separating the light emission surface from the substrate (TFT).

Conventionally, top-emitting OLED devices are manufactured to include a structure having a total reflection anode electrode and a semi-transparent cathode electrode to realize top-emission of OLED devices. The structure is optimized in order to effectively adjust microcavity effect of TOLED, so as to improve color of light emitted by OLED devices and enhance coupling efficiency of light emitted by devices.

SUMMARY OF THE DISCLOSURE

The present disclosure provides an OLED display panel and a method for manufacturing the same in order to improve color of light emitted by OLED devices To achieve the above mentioned objective, the present disclosure provides the following technical schemes.

In one aspect, the present disclosure provides a method for manufacturing an organic light-emitting diode (OLED) display panel, comprising:

a step S30 of forming an anode electrode modifying layer on an anode electrode, wherein the anode electrode modifying layer has a three-dimensional embossment grating structure;

a step S40 of forming a first common layer, a light-emitting layer, and a second common layer sequentially on the anode electrode modifying layer; and a step S50 of forming a cathode electrode layer on the second common layer.

According to one preferred embodiment of the present disclosure, before the step S30, the method further comprises:

a step S10 of providing a base substrate and forming a thin film transistor layer on the base substrate; and a step S20 of forming an anode electrode layer on the thin film transistor layer and performing a first masking process using a mask for the anode electrode layer to form at least two anode electrodes in the anode electrode layer.

According to one preferred embodiment of the present disclosure, the step S30 comprises:

a step S31 of coating an azobenzene-based compound solution on the anode electrode layer to form an azobenzene-based compound film; and a step S32 of irradiating the azobenzene-based compound film with laser to form the anode electrode modifying layer having the three-dimensional embossment grating structure.

According to one preferred embodiment of the present disclosure, the anode electrode modifying layer is formed from an azobenzene-based compound; and the azobenzene-based compound is an azobenzene-based polymer compound or an azobenzene-based small molecule compound.

According to one preferred embodiment of the present disclosure, the azobenzene-based compound includes at least one functional group for transporting holes and at least one functional group for increasing solubility of the azobenzene-based compound in an organic solvent.

According to one preferred embodiment of the present disclosure, the first common layer comprises a hole injection layer and a hole transport layer, and the second common layer comprises an electron injection layer and an electron transport layer.

In another aspect, the present disclosure provides an organic light-emitting diode (OLED) display panel, comprising:

a thin film transistor layer;

an anode electrode layer disposed on the thin film transistor layer, wherein the anode electrode layer is configured to provide holes used for receiving electrons;

an anode electrode modifying layer disposed on the anode electrode layer, wherein the anode electrode modifying layer has a three-dimensional embossment grating structure, the anode electrode modifying layer includes an azobenzene-based compound, and the azobenzene-based compound is an azobenzene-based polymer compound or an azobenzene-based small molecule compound;

a first common layer disposed on the anode electrode modifying layer, wherein the first common layer is configured for injecting and transporting holes;

a light-emitting layer disposed on the first common layer;

a second common layer disposed on the first common layer, wherein the second common layer is configured for injecting and transporting electrons; and a cathode electrode layer disposed on the second common layer, wherein the cathode electrode layer is configured to provide electrons.

According to one preferred embodiment of the present disclosure, the azobenzene-based compound includes at least one functional group for transporting holes and at least one functional group for increasing solubility of the azobenzene-based compound in an organic solvent.

According to one preferred embodiment of the present disclosure, the first common layer comprises a hole injection layer and a hole transport layer, and the second common layer comprises an electron injection layer and an electron transport layer.

In a further aspect, the present disclosure provides an organic light-emitting diode (OLED) display panel, comprising:

a thin film transistor layer;

an anode electrode layer disposed on the thin film transistor layer, wherein the anode electrode layer is configured to provide holes used for receiving electrons;

an anode electrode modifying layer disposed on the anode electrode layer, wherein the anode electrode modifying layer has a three-dimensional embossment grating structure;

a first common layer disposed on the anode electrode modifying layer, wherein the first common layer is configured for injecting and transporting holes;

a light-emitting layer disposed on the first common layer;

a second common layer disposed on the first common layer, wherein the second common layer is configured for injecting and transporting electrons; and a cathode electrode layer disposed on the second common layer, wherein the cathode electrode layer is configured to provide electrons.

According to one preferred embodiment of the present disclosure, the anode electrode modifying layer includes at least one functional group for transporting holes and at least one functional group for increasing solubility of the anode electrode modifying layer in an organic solvent.

According to one preferred embodiment of the present disclosure, the first common layer comprises a hole injection layer and a hole transport layer, and the second common layer comprises an electron injection layer and an electron transport layer.

Compared to the prior art, the present disclosure disposes an anode electrode modifying layer on the anode electrodes. The anode electrode modifying layer has a three-dimensional embossment grating structure. By precisely controlling the three-dimensional embossment grating structure, microcavity effect of TOLED can be adjusted. Accordingly, the present disclosure not only improves color of light emitted by OLED devices but enhances coupling efficiency of light emitted by devices.

BRIEF DESCRIPTION OF THE DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
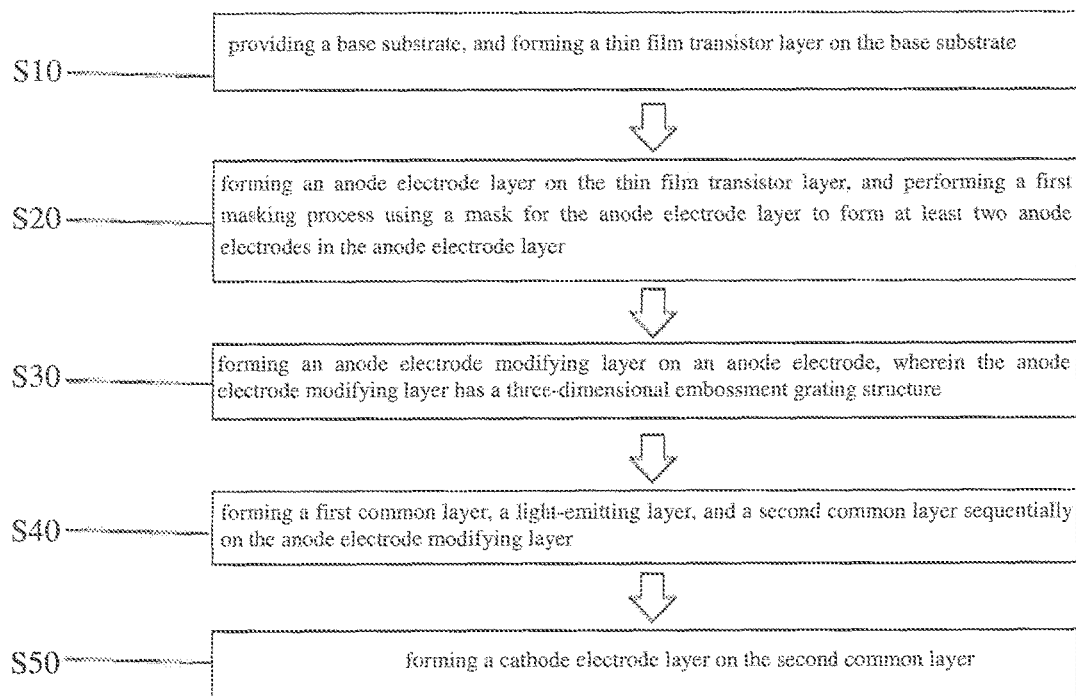
FIG. 1 is a flowchart showing a method for manufacturing an OLED display panel according to one embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Conventional OLED display panels are manufactured to include a structure having a total reflection anode electrode and a semi-transparent cathode electrode to realize top-emission of OLED devices. Without such structure, the present disclosure modifies conventional OLED display panels by introducing a new structure thereinto to realize improvement of color of light emitted by OLED devices and enhancement of coupling efficiency of light emitted by devices.

FIG. 1 is a flowchart showing a method for manufacturing an OLED display panel according to one embodiment of the present disclosure. The method includes the following steps S10-S50.

In a step S10, a base substrate 101 is provided, and a thin film transistor layer 102 is formed on the base substrate 102.

Specifically, a base substrate 101 is provided first. A first metal layer is deposited on the base substrate 101 using a magnetically enhanced sputtering process. The first metal layer can be made of a metal such as molybdenum, aluminum, aluminum-nickel alloy, molybdenium-tungsten alloy, chromium, or copper. Alternatively, the first metal layer has a combined structure composed of a plurality of the above described metal films.

Next, a first photoresist layer is coated on the first metal layer. By using a mask to perform a patterning process including steps of exposure, development, etching, and stripping, a plurality of gate electrodes and a plurality of gate lines are formed on the base substrate 101.

Then, a gate insulation layer is chemically deposited on the base substrate 101. In one preferred embodiment, the gate insulation layer is made of silicon nitride, or a combination of silicon oxide and silicon oxynitride.

Thereafter, a metal oxide film configured as an active layer is deposited on the gate insulation layer by using sputtering technique. The magnetically enhanced sputtering process is further employed to deposited a second metal layer on the active layer.

Figure 2:
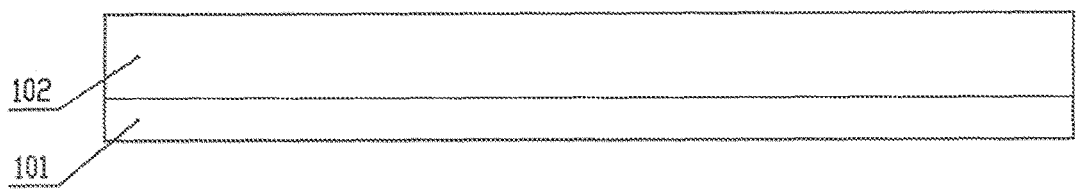
FIGS. 2-7 are cross-sectional views of an OLED display panel during manufacturing process thereof according to one embodiment of the present disclosure.

Finally, a second photoresist layer is coated on the base substrate 101 having the gate insulation layer, the active layer, and the second metal layer formed thereon. By using a mask to perform a patterning process including steps of exposure, development, etching, and stripping, a plurality of source electrodes, a plurality of drain electrodes, and a patterned active layer are formed on the base substrate 101. Lastly, a passivation layer is deposited on the base substrate, so as to generate a structure as shown in FIG. 2. Preferably, the passivation layer is generally made of silicon nitride.

In a step S20, an anode electrode layer 103 is formed on the thin film transistor layer 102, and a first masking process using a mask for the anode electrode layer 103 is performed to form at least two anode electrodes in the anode electrode layer 103.

Figure 3:
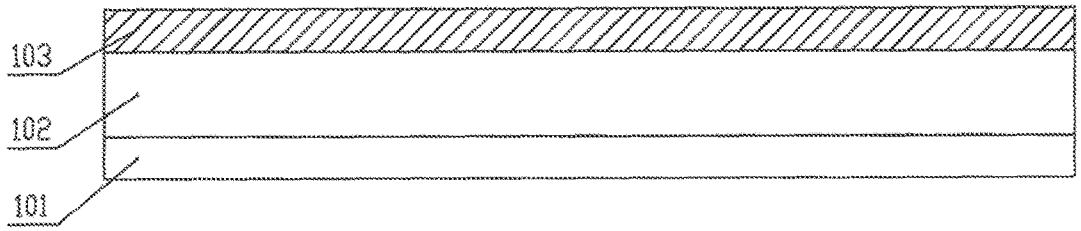

Specifically, an anode electrode layer 103 is formed on the thin film transistor layer 102 first. As shown in FIG. 3, a third photoresist layer is coated on the anode electrode layer 103. By using a mask to perform a patterning process including steps of exposure, development, etching, and stripping, an array including at least two anode electrodes is formed on the base substrate 101.

The anode electrode layer 103 is configured to provide holes used for receiving electrons, and the anode electrode layer 103 is transparent to allow emitted light to pass therethrough.

In a step S30, an anode electrode modifying layer 104 is formed on the anode electrodes. The anode electrode modifying layer has a three-dimensional embossment grating structure.

Specifically, an azobenzene-based compound solution is coated on each of the patterned anode electrodes by spin coating, spray coating, or blade coating to form an azobenzene-based compound film first.

Figure 4:
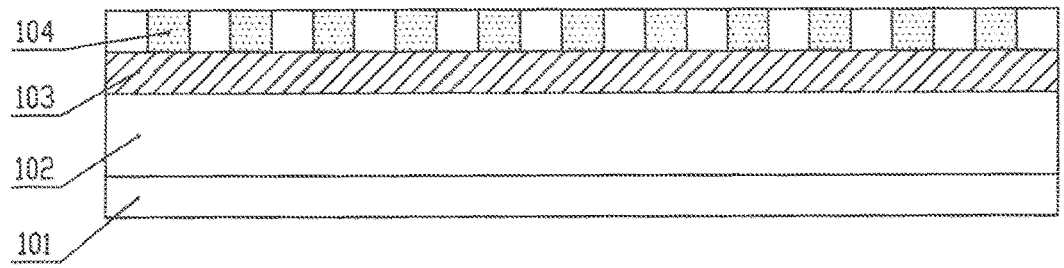
Figure 5:
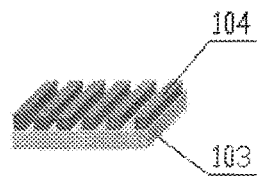

Then, a two-beam interference laser system is used to irradiate the azobenzene-based compound film, in order to make the azobenzene-based compound film form an anode electrode modifying layer 104 having a three-dimensional embossment grating structure 104, as shown in FIG. 4 and FIG. 5.

The azobenzene-based compound is an azobenzene-based polymer compound or an azobenzene-based small molecule compound. The azobenzene-based compound includes at least one functional group (such as carbazole, aniline, or thiophene) for transporting holes, and at least one functional group (such as short-chain alkyl chains) for increasing solubility of the azobenzene-based compound in an organic solvent.

In a step S40, a first common layer 105, a light-emitting layer 106, and a second common layer 107 are sequentially formed on the anode electrode modifying layer 104.

Figure 6:
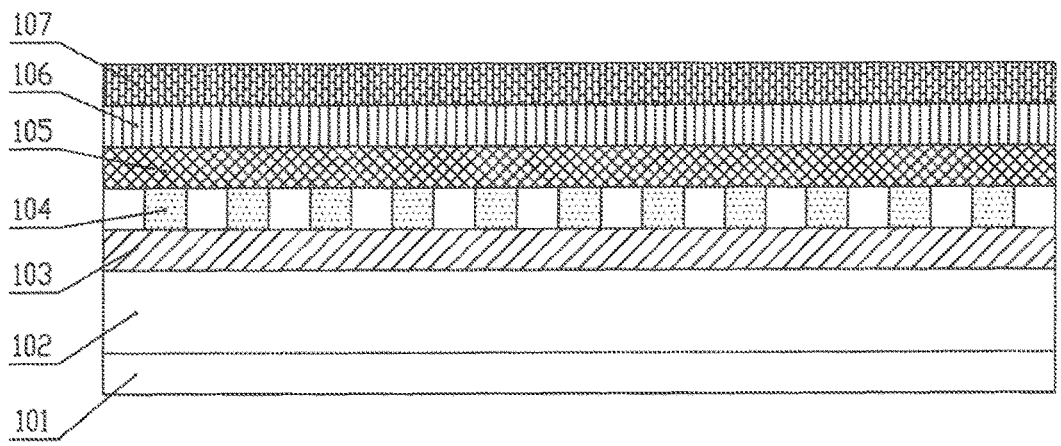

Specifically, identically to prior art, a first common layer 105, a light-emitting layer 106, and a second common layer 107 are sequentially deposited on the anode electrode modifying layer 104, as can be seen in FIG. 6.

The first common layer 105 can be composed of one layer, or two or more layers. In one embodiment, the first common layer 105 includes a hole injection layer and a hole transport layer. The hole injection layer and the hole transport layer are sequentially formed in the direction away from the anode electrodes. The hole injection layer and the hole transport layer have similar functions, and can be collectively named a hole transmission function layer.

The light-emitting layer 106 is formed on the first common layer 105. The light-emitting layer 106 includes at least two light-emitting elements with each of them corresponding to one of the anode electrodes. The light-emitting layer 106 is made of an organic semiconductor material having a special band gap structure, and can emit photons of certain wavelength after receiving electrons moved from the anode electrodes. These photons enter our eyes to form colors that we see.

The second common layer 107 is formed on the first common layer 105. The second common layer 107 can be composed of one layer, or two or more layers. In one embodiment, the second common layer 107 includes an electron injection layer and an electron transport layer. The electron injection layer and the electron transport layer are sequentially formed in the direction away from the cathode electrodes. The electron injection layer and the electron transport layer have similar functions, and can be collectively named an electron transmission function layer.

In a step S50, a cathode electrode layer 108 is formed on the second common layer 107.

Figure 7:
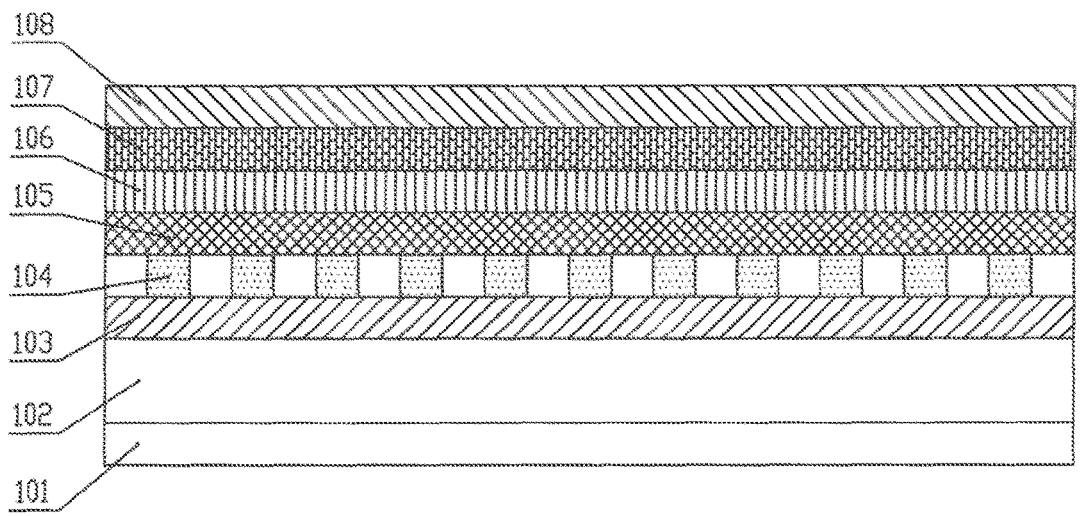

Specifically, as shown in FIG. 7, the cathode electrode layer 108 is formed on the second common layer 107. The cathode electrode layer 108 is normally made of an alloy with low work function, and generates electrons under a given voltage. The electrons pass through the electron injection layer and the electron transport layer, and combine with holes in the light-emitting layer 106. Preferably, in one embodiment, the cathode electrode layer 108 is semi-transparent.

Compared to the prior art, the present disclosure disposes an anode electrode modifying layer on the anode electrodes. The anode electrode modifying layer is formed from an azobenzene-based compound. The azobenzene-based compound includes at least one functional group for transporting holes and at least one functional group for increasing solubility of the azobenzene-based compound in a generally used organic solvent. Additionally, the anode electrode modifying layer has a three-dimensional embossment grating structure. By precisely controlling the three-dimensional embossment grating structure, microcavity effect of TOLED can be adjusted. Accordingly, the present disclosure not only improves color of light emitted by OLED devices but enhances coupling efficiency of light emitted by devices.

Figure 8:
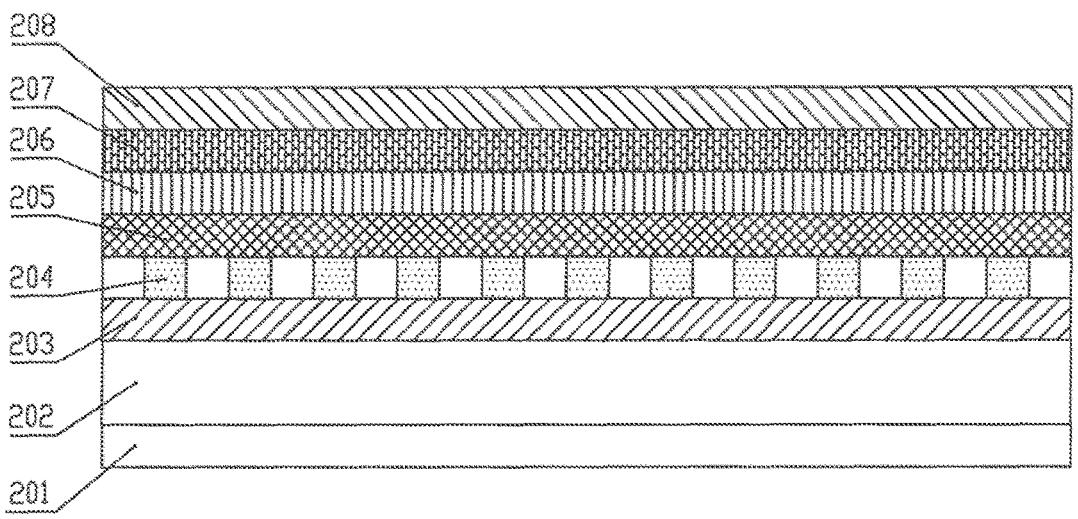
FIG. 8 is a cross-sectional view showing a film structure of an OLED display panel according to one preferred embodiment of the present disclosure.

FIG. 8 is a cross-sectional view showing a film structure of an OLED display panel according to one preferred embodiment of the present disclosure. The OLED display panel includes a thin film transistor layer 202, an anode electrode layer 203, an anode electrode modifying layer 204, a first common layer 205, a light-emitting layer 206, a second common layer 207, and a cathode electrode layer 208.

The thin film transistor layer 202 is formed on the base substrate 201. The thin film transistor layer 202 includes an active layer, a gate insulation layer, a gate electrode layer, a source/drain electrode layer, and a passivation layer.

The gate electrode layer is formed from a first metal layer which is patterned by steps including exposure, development, etching, and stripping. The first metal layer can be made of a metal such as molybdenum, aluminum, aluminum-nickel alloy, molybdenium-tungsten alloy, chromium, or copper. Alternatively, the first metal layer has a combined structure composed of a plurality of the above described metal films.

The gate insulation layer is formed on the base substrate 201. In one preferred embodiment, the gate insulation layer is made of silicon nitride, or a combination of silicon oxide and silicon oxynitride.

The active layer is deposited on the gate insulation layer by using sputtering technique. The active layer is a metal oxide film.

A second metal layer is formed on the base substrate 201 having the gate insulation layer and the active layer. By using a mask to perform a patterning process including steps of exposure, development, etching, and stripping, a plurality of source electrodes, a plurality of drain electrodes, and a patterned active layer are formed on the base substrate 201.

A passivation layer is deposited on the base substrate 201. Preferably, the passivation layer is generally made of silicon nitride.

The anode electrode layer 203 is formed on the thin film transistor layer 202. By performing a patterning process for the anode electrode layer 203, an array including at least two anode electrodes is formed on the base substrate 201. The anode electrode layer 203 is configured to provide holes used for receiving electrons, and the anode electrode layer 203 is transparent to allow emitted light to pass therethrough.

The anode electrode modifying layer 204 is formed on the anode electrode layer 203. After the anode electrodes are patterned, an azobenzene-based compound solution is coated on each of the patterned anode electrodes by spin coating, spray coating, or blade coating to form an azobenzene-based compound film.

Then, a two-beam interference laser system is used to irradiate the azobenzene-based compound film, in order to make the azobenzene-based compound film form an anode electrode modifying layer 104 having a three-dimensional embossment grating structure 204, as shown in FIG. 8.

The azobenzene-based compound is an azobenzene-based polymer compound or an azobenzene-based small molecule compound. The azobenzene-based compound includes at least one functional group (such as carbazole, aniline, or thiophene) for transporting holes, and at least one functional group (such as short-chain alkyl chains) for increasing solubility of the azobenzene-based compound in an organic solvent.

The first common layer 205 can be composed of one layer, or two or more layers. In one embodiment, the first common layer 205 includes a hole injection layer and a hole transport layer. The hole injection layer and the hole transport layer are sequentially formed in the direction away from the anode electrodes. The hole injection layer and the hole transport layer have similar functions, and can be collectively named a hole transmission function layer.

The light-emitting layer 206 is formed on the first common layer 205. The light-emitting layer 206 includes at least two light-emitting elements with each of them corresponding to one of the anode electrodes. The light-emitting layer 206 is made of an organic semiconductor material having a special band gap structure, and can emit photons of certain wavelength after receiving electrons moved from the anode electrodes. These photons enter our eyes to form colors that we see.

The second common layer 207 is formed on the first common layer 205. The second common layer 207 can be composed of one layer, or two or more layers. In one embodiment, the second common layer 207 includes an electron injection layer and an electron transport layer. The electron injection layer and the electron transport layer are sequentially formed in the direction away from the cathode electrodes. The electron injection layer and the electron transport layer have similar functions, and can be collectively named an electron transmission function layer.

The cathode electrode layer 208 is formed on the second common layer 207. The cathode electrode layer 208 is normally made of an alloy with low work function, and generates electrons under a given voltage. The electrons pass through the electron injection layer and the electron transport layer, and combine with holes in the light-emitting layer 206. Preferably, in one embodiment, the cathode electrode layer 208 is semi-transparent.

The present disclosure provides an OLED display panel and a method for manufacturing the same. The OLED display panel includes a thin film transistor layer, an anode electrode layer, an anode electrode modifying layer, a first common layer, a light-emitting layer, a second common layer, and a cathode electrode layer. The anode electrode modifying layer is formed from an azobenzene-based compound. The azobenzene-based compound includes at least one functional group for transporting holes and at least one functional group for increasing solubility of the azobenzene-based compound in a generally used organic solvent. Additionally, the anode electrode modifying layer has a three-dimensional embossment grating structure. By precisely controlling the three-dimensional embossment grating structure, microcavity effect of TOLED can be adjusted. Accordingly, the present disclosure not only improves color of light emitted by OLED devices but enhances coupling efficiency of light emitted by devices.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light-emitting diode (OLED) display panel, comprising:
   a thin film transistor layer;
   an anode electrode layer disposed on the thin film transistor layer, wherein the anode electrode layer is configured to provide holes used for receiving electrons;
   an anode electrode modifying layer disposed on the anode electrode layer, wherein the anode electrode modifying layer has a three-dimensional embossment grating structure, the anode electrode modifying layer includes an azobenzene-based compound, and the azobenzene-based compound is an azobenzene-based polymer compound or an azobenzene-based small molecule compound, wherein the azobenzene-based compound includes at least one functional group for transporting holes and at least one functional group for increasing solubility of the azobenzene-based compound in an organic solvent;
   a first common layer disposed on the anode electrode modifying layer, wherein the first common layer is configured for injecting and transporting holes;
   a light-emitting layer disposed on the first common layer;
   a second common layer disposed on the first common layer, wherein the second common layer is configured for injecting and transporting electrons; and
   a cathode electrode layer disposed on the second common layer, wherein the cathode electrode layer is configured to provide electrons.

2. The OLED display panel according to claim 1, wherein the first common layer comprises a hole injection layer and a hole transport layer, and the second common layer comprises an electron injection layer and an electron transport layer.

* * * * *